(12) United States Patent  
Lin

(10) Patent No.: US 8,995,143 B2
(45) Date of Patent: Mar. 31, 2015

(54) PIVOTAL ASSEMBLY APPLIED TO BOARD

(71) Applicants: Inventec (Pudong) Technology Corporation, Shanghai (CN); Inventec Corporation, Taipei (TW)

(72) Inventor: Yen-Cheng Lin, Taipei (TW)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 165 days.

(21) Appl. No.: 13/778,540

(22) Filed: Feb. 27, 2013

(65) Prior Publication Data

US 2014/0133084 A1    May 15, 2014

(30) Foreign Application Priority Data

Nov. 14, 2012 (CN) .......................... 2012 1 0455085

(51) Int. Cl.
*H05K 5/00* (2006.01)
*G06F 1/18* (2006.01)
*H05K 1/14* (2006.01)
*H05K 3/36* (2006.01)

(52) U.S. Cl.
CPC ............... *G06F 1/185* (2013.01); *H05K 1/141* (2013.01); *H05K 1/148* (2013.01); *H05K 3/366* (2013.01); *H05K 2201/042* (2013.01); *H05K 2201/09081* (2013.01); *H05K 2201/2036* (2013.01); *H05K 2201/10159* (2013.01); *E05Y 2900/606* (2013.01)
USPC .......................................... 361/755; 361/792

(58) Field of Classification Search
USPC .......... 361/755, 792; 455/575.1–575.4, 575.7
See application file for complete search history.

(56) References Cited

U.S. PATENT DOCUMENTS

| | | | | |
|---|---|---|---|---|
| 2,839,779 A * | 6/1958 | Haag | ................................ | 16/375 |
| 3,147,402 A * | 9/1964 | Hochstetler | .................... | 361/707 |
| 4,206,532 A * | 6/1980 | DeLorenzo | ....................... | 16/377 |
| 4,353,146 A * | 10/1982 | Brockhaus | ....................... | 16/387 |
| 4,515,424 A * | 5/1985 | Sakurai | ......................... | 439/325 |
| 4,709,121 A * | 11/1987 | Shores | .......................... | 174/375 |
| 5,636,102 A * | 6/1997 | Fujino et al. | .............. | 361/679.27 |
| 6,822,878 B2 * | 11/2004 | Dobbs et al. | ................... | 361/807 |
| 2009/0080164 A1 * | 3/2009 | Purcell et al. | .................. | 361/737 |

* cited by examiner

*Primary Examiner* — Hung S Bui
(74) *Attorney, Agent, or Firm* — Huffman Law Group, PC

(57) ABSTRACT

A pivotal assembly applied to a board includes a first board, a first pivotal member, and a pivotal plate. The first pivotal member is fixed to the first board and has a first retaining structure. The pivotal plate is pivotally connected to the first pivotal member and has a first protrusion. The first protrusion is retained in the first retaining structure, so as to make the first board limitedly rotate to be perpendicular or parallel to the pivotal plate.

9 Claims, 8 Drawing Sheets

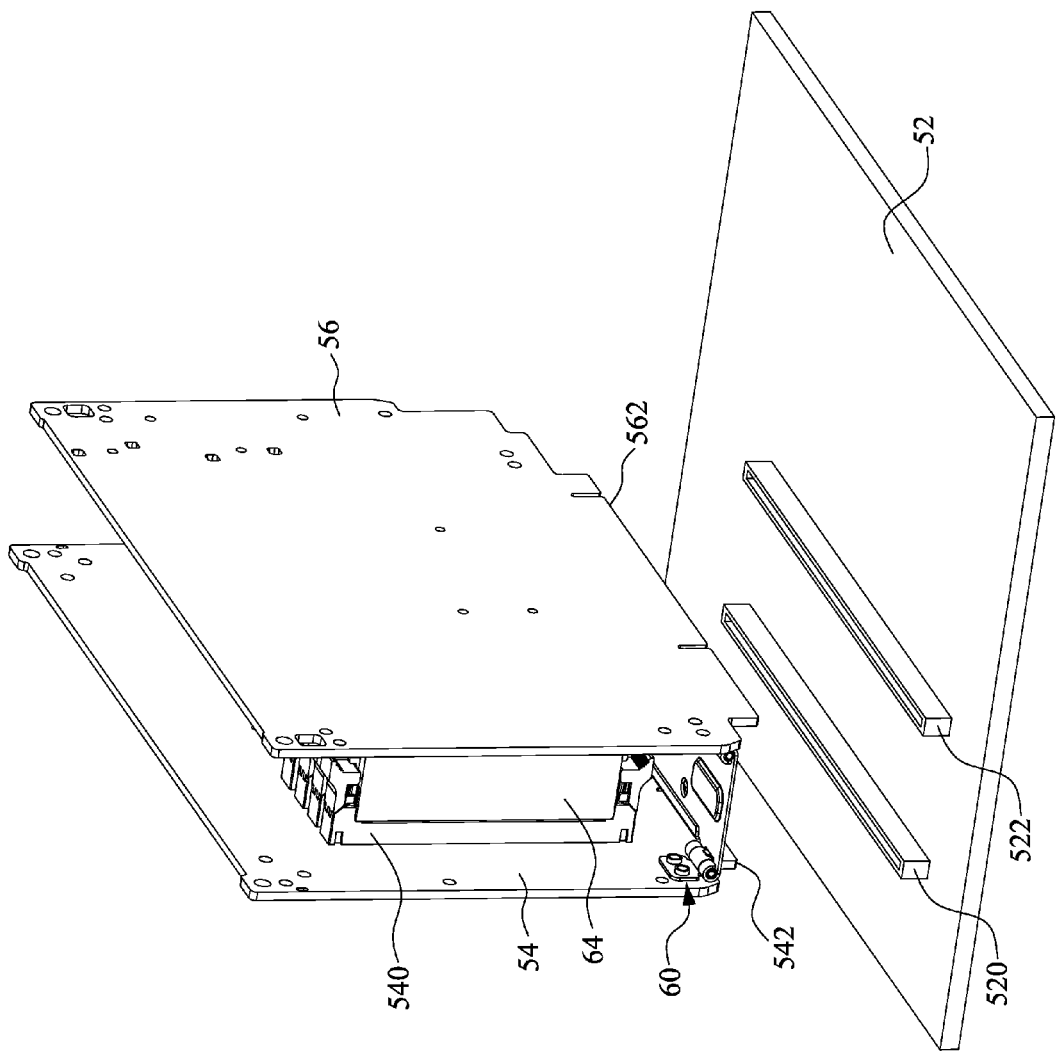

PIVOTAL ASSEMBLY APPLIED TO BOARD

RELATED APPLICATIONS

This application claims priority to China Application Serial Number 201210455085.3, filed Nov. 14, 2012, which is herein incorporated by reference.

BACKGROUND

1. Field of Invention

The invention relates to a pivotal assembly applied to a board. More particularly, the invention relates to a pivotal assembly applied to a riser board for inserting memory modules in a computer system.

2. Description of Related Art

In existing computer systems, the memory module, such as a Dual In-line Memory Module (DIMM), is generally plugged directly into memory sockets of a motherboard. However, in order to use more memory modules in a server, a riser board is used to augment the number of the memory modules. In all of the current approaches, a plurality of memory modules are plugged onto a single riser board to form a memory combination, and then the whole memory combination is plugged into a riser slot on the motherboard. A control chip is configured on the riser board for controlling reading data from and writing data to various memory modules on the riser board.

However, the current techniques for plugging a plurality of riser boards into the motherboard all enable the memory modules on each riser board to face toward the same direction and the riser boards are arranged closely. Nonetheless, it is inevitable that the control chip configured on the riser board occupies a portion of the space on the riser board, and thus the memory sockets cannot be configured in that occupied space, so that the space between two riser boards corresponding to the control chip is unused, not being utilized efficiently. Therefore, in the case that the height and space of the server are limited, how to place more memory modules in the limited space is a challenge to those in the art.

SUMMARY

The invention provides a pivotal assembly applied to a board, which includes a first board, a first pivotal member, and a pivotal plate. The first pivotal member is fixed to the first board and has a first retaining structure. The pivotal plate is pivotally connected to the first pivotal member and has a first protrusion. The first protrusion is retained in the first retaining structure, so as to make the first board limitedly rotate to be perpendicular or parallel to the pivotal plate.

In an embodiment of the invention, the abovementioned first pivotal member includes a first fixing portion, a first pivotal portion, and a first pivotal axis. The first fixing portion is fixed to the first board. The first pivotal portion is connected to the first fixing portion and bent relative to the first fixing portion. The first pivotal axis is pivotally connected to the inner wall of the first pivotal portion.

In an embodiment of the invention, the abovementioned pivotal plate includes a main body and two second pivotal portions. The second pivotal portions are connected to the main body and are bent relative to the main body. The first pivotal portion is arranged between the second pivotal portions side by side. The first pivotal axis is further pivotally connected to the inner walls of the second pivotal portions.

In an embodiment of the invention, the abovementioned first retaining structure is located on the first pivotal portion. The first protrusion is connected to the main body and extends into the first retaining structure. The first retaining structure has a first retaining edge and a second retaining edge opposite to each other. During rotation of the first board relative to the pivotal plate, the first protrusion is limitedly moved between the first retaining edge and the second retaining edge.

In an embodiment of the invention, the abovementioned first retaining edge is adjacent to the end of the first pivotal portion that is connected to the first fixing portion. The second retaining edge is adjacent to the end of the first pivotal portion that is away from the first fixing portion. When the first board rotates relative to the pivotal plate to make the first protrusion abut against the first retaining edge, the first board is parallel to the pivotal plate. When the first board rotates relative to the pivotal plate to make the first protrusion abut against the second retaining edge, the first board is perpendicular to the pivotal plate.

In an embodiment of the invention, the abovementioned pivotal plate further has a second protrusion. The first protrusion and the second protrusion are respectively located at two ends of the pivotal plate. The pivotal assembly applied to the board further includes a second board and a second pivotal member. The second pivotal member is fixed to the second board and has a second retaining structure. The first pivotal member and the second pivotal member are pivotally connected to two ends of the pivotal plate, respectively. The second protrusion is retained in the second retaining structure, so as to make the second board limitedly rotate to be perpendicular or parallel to the pivotal plate. When both of the first board and the second board are perpendicular to the pivotal plate, the first board and the second board are located face to face.

In an embodiment of the invention, the abovementioned second pivotal member includes a second fixing portion, a third pivotal portion, and a second pivotal axis. The second fixing portion is fixed to the second board. The third pivotal portion is connected to the second fixing portion and is bent relative to the second fixing portion. The second pivotal axis is pivotally connected to the inner wall of the third pivotal portion.

In an embodiment of the invention, the abovementioned pivotal plate includes a main body and two fourth pivotal portions. The fourth pivotal portions are connected to the main body and are bent relative to the main body. The third pivotal portion is arranged between the fourth pivotal portions side by side, and the second pivotal axis is further pivotally connected to the inner walls of the fourth pivotal portions.

In an embodiment of the invention, the abovementioned second retaining structure is located on the third pivotal portion. The second protrusion is connected to the main body and extends into the second retaining structure. The second retaining structure has a third retaining edge and a fourth retaining edge opposite to each other. During rotation of the second board relative to the pivotal plate, the second protrusion is limitedly moved between the third retaining edge and the fourth retaining edge.

In an embodiment of the invention, the abovementioned third retaining edge is adjacent to the end of the second pivotal portion that is connected to the second fixing portion. The fourth retaining edge is adjacent to the end of the second pivotal portion that is away from the second fixing portion. When the second board rotates relative to the pivotal plate to make the second protrusion abut against the third retaining edge, the second board is parallel to the pivotal plate. When the second board rotates relative to the pivotal plate to make the second protrusion abut against the fourth retaining edge, the second board is perpendicular to the pivotal plate.

In view of the above, an essential feature of the invention is that two boards of the pivotal assembly are pivotally connected to the pivotal plate, respectively, through two pivotal members, so that the two boards can to be unfolded and folded like a book. Another essential feature of the invention is that the two pivotal members, respectively, have a retaining structure for retaining the corresponding protrusion configured on the pivotal plate, so that the a distance between two riser boards can be maintained when the two boards are folded to each other, thereby avoiding collision of the two boards.

BRIEF DESCRIPTION OF THE DRAWINGS

FIG. 5A is a perspective view illustrating the memory combination of FIG. 4 after being folded and before being plugged to a motherboard in the computer system;

DETAILED DESCRIPTION

Figure 1:
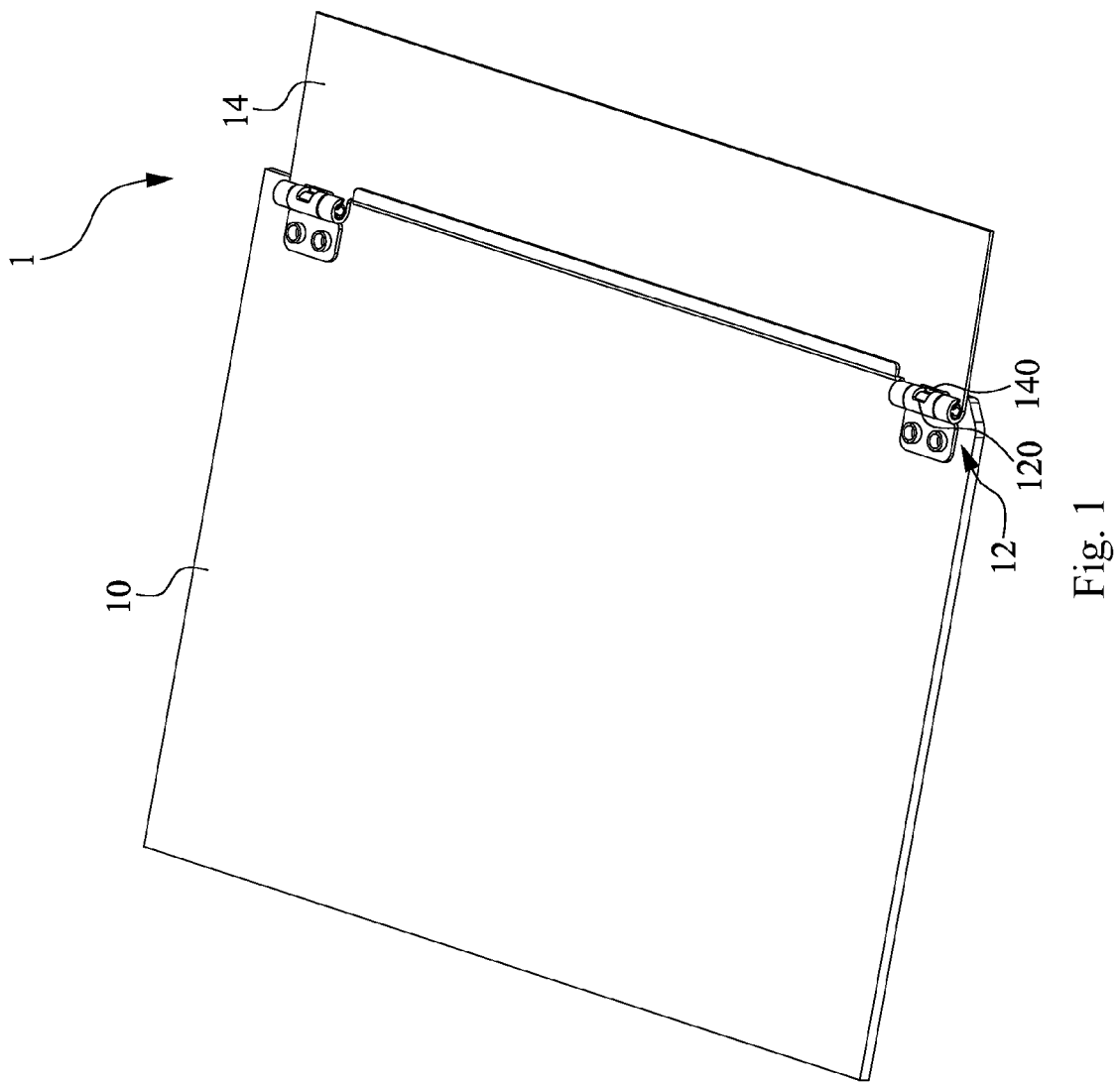
FIG. 1 is a perspective view illustrating a pivotal assembly applied to board according to an embodiment of the invention.

A plurality of embodiments of the invention will be disclosed hereafter with reference to drawings. For purposes of clear illustration, many details in practice will be described together in the disclosure. However, it should be understood that these details in practice are not intended to limit the invention. That is, in some embodiments of the invention, these details in practice are unnecessary. Additionally, for purposes of simplifying drawings, some conventional structures and elements in the drawings will be illustrated schematically FIG. 1 illustrates a perspective view of a pivotal assembly 1 applied to board according to an embodiment of the invention.

As shown in FIG. 1, in this embodiment, the pivotal assembly 1 applied to board includes a board 10, a pivotal member 12, and a pivotal plate 14. The pivotal member 12 is fixed to the board 10 and has a retaining structure 120. The pivotal plate 14 is pivotally connected to the pivotal member 12 and has a protrusion 140. The protrusion 140 is retained in the retaining structure 120, so as to make the board 10 limitedly rotate to be perpendicular or parallel to the pivotal plate 14.

Figure 2:
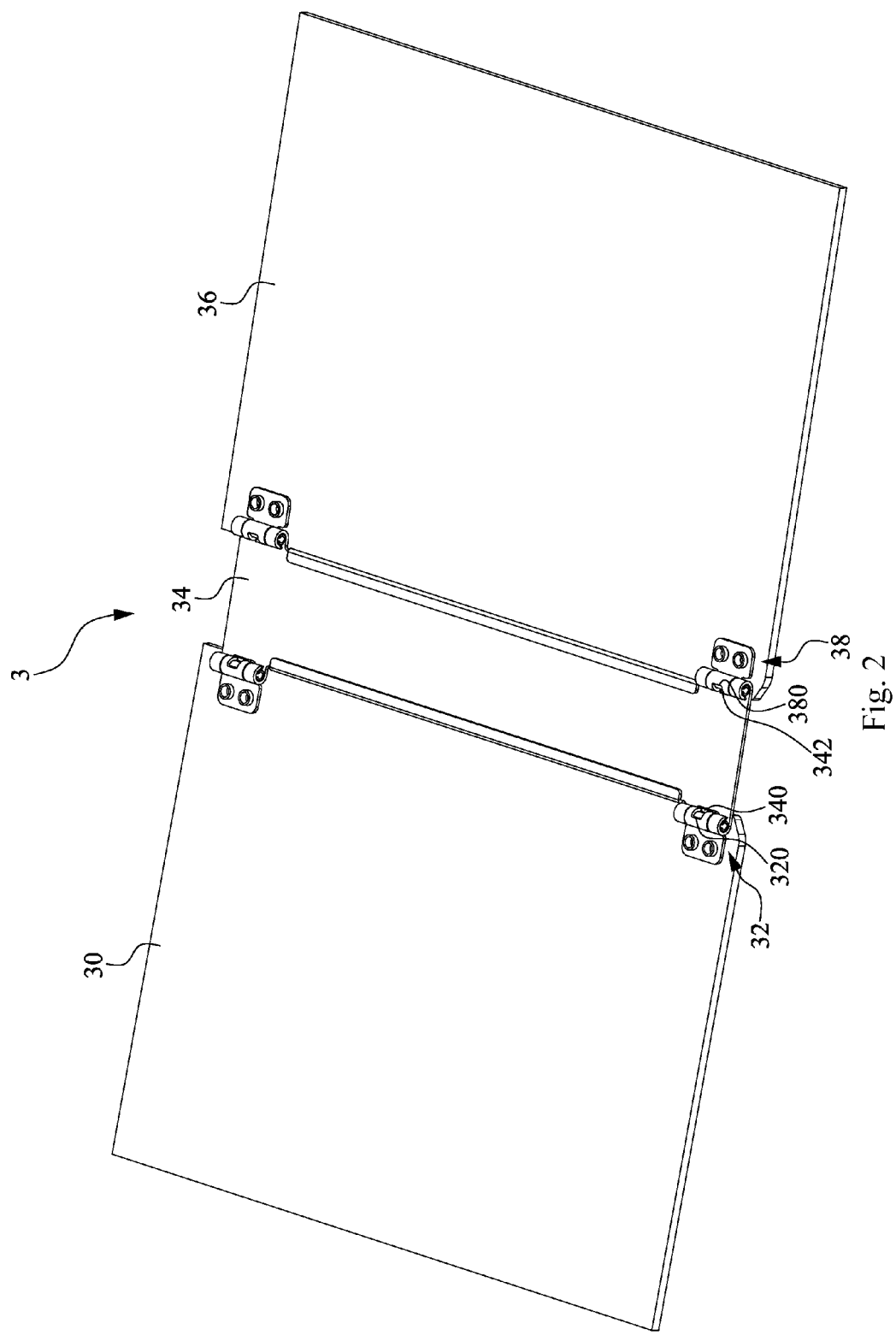
FIG. 2 is a perspective view illustrating a pivotal assembly applied to board according to another embodiment of the invention.

FIG. 2 illustrates a perspective view of a pivotal assembly 3 applied to a board according to another embodiment of the invention.

As shown in FIG. 2, the pivotal assembly 3 applied to a board includes a first board 30, a first pivotal member 32, a pivotal plate 34, a second board 36, and a second pivotal member 38. The first pivotal member 32 is fixed to the first board 30 and has a first retaining structure 320. The pivotal plate 34 is pivotally connected to the first pivotal member 32 and has a first protrusion 340. The first protrusion 340 is retained in the first retaining structure 320, so as to make the first board 30 limitedly rotate to be perpendicular or parallel to the pivotal plate 34.

Additionally, the pivotal plate 34 further has a second protrusion 342. The first protrusion 340 and the second protrusion 342 are respectively located at two ends of the pivotal plate 34. The second pivotal member 38 is fixed to the second board 36 and has a second retaining structure 380. The first pivotal member 32 and the second pivotal member 38 are pivotally connected to two ends of the pivotal plate 34, respectively. The second protrusion 342 is retained in the second retaining structure 380, so as to make the second board 36 limitedly rotate to be perpendicular or parallel to the pivotal plate 34. Moreover, when both of the first board 30 and the second board 36 are perpendicular to the pivotal plate 34, the first board 30 and the second board 36 are located face to face.

It should be noted that the detailed structure and operation manner relating to the board 10, the pivotal member 12, and the pivotal plate 14 in FIG. 1, as well as the detailed structure and operation manner relating to the first board 30, first pivotal member 32, pivotal plate 34, second plate 36, and second pivotal member 38 in FIG. 2, can become apparent from embodiments relating to the memory combination illustrated in FIGS. 3-7 hereafter.

Figure 3:
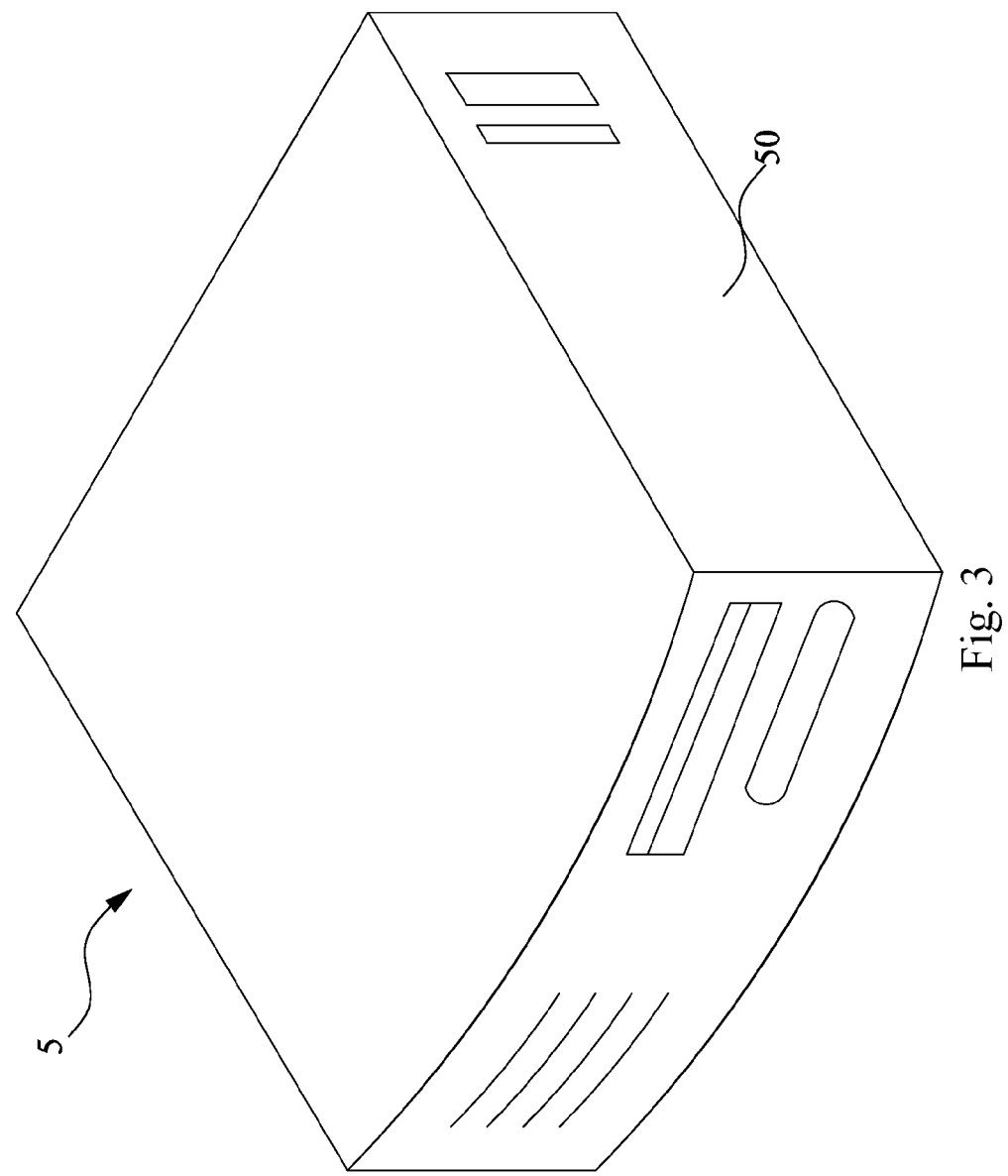
FIG. 3 is a perspective view illustrating a computer system according to an embodiment of the invention.

FIG. 3 illustrates a perspective view of a computer system 5 according to an embodiment of the invention.

In FIG. 3, the computer system 5 of this embodiment is exemplified as a server, although the invention is not limited to such. For any computer system 5, as long as it is required to plug many memory modules into the motherboard in the computer system 5, the concept of the memory combination of the invention can be applied to effectively enhance the space utilization inside a housing 50 of the computer system 5.

Figure 4:
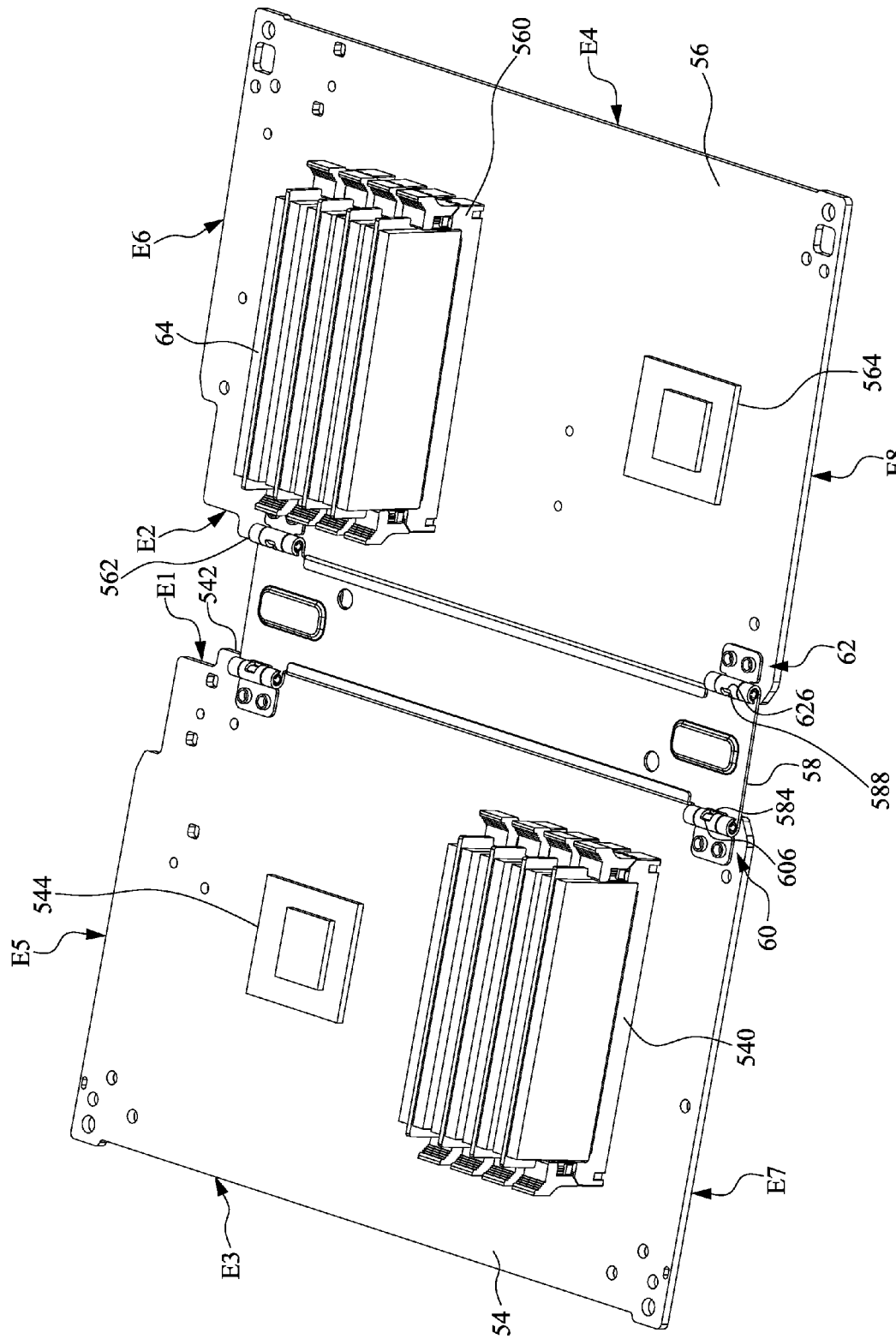
FIG. 4 is an unfolded view illustrating a memory combination according to an embodiment of the invention.
Figure 5B:
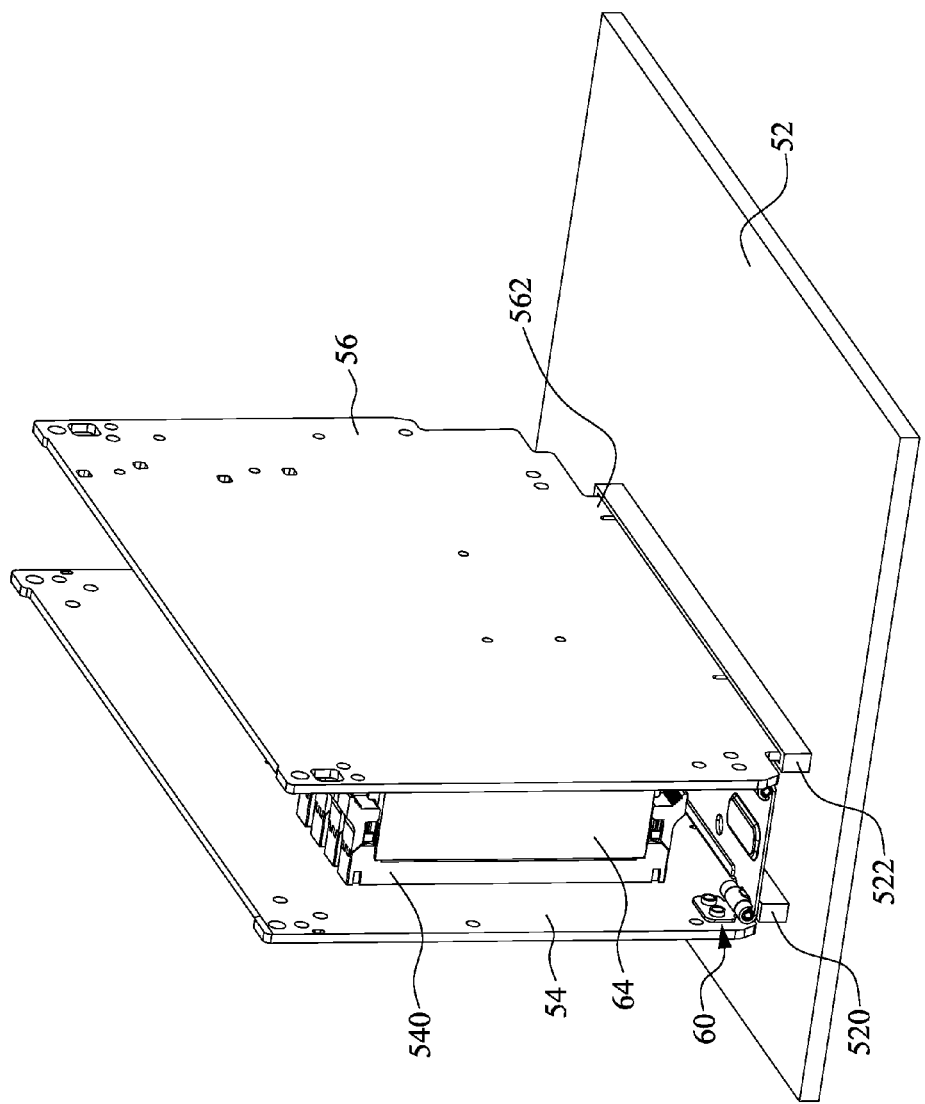
FIG. 5B is a perspective view illustrating the memory combination in FIG. 5A after being plugged to the motherboard.

FIG. 4 is an unfolded view illustrating the memory combination according to an embodiment of the invention. FIG. 5 is a perspective view illustrating the memory combination in FIG. 4 after being folded and before being plugged to a motherboard 52 in the computer system 5. FIG. 5B is a perspective view illustrating the memory combination in FIG. 5A after being plugged to the motherboard 52.

As shown in FIG. 4, in this embodiment, the memory combination includes a first riser board 54, a first pivotal member 60, a second riser board 56, a second pivotal member 62, and a pivotal plate 58. The first pivotal member 60 is fixed to the first riser board 54. The second pivotal member 62 is fixed to the second riser board 56. Two ends of the pivotal plate 58 are pivotally connected to the first pivotal member 60 and the second pivotal member 62, respectively.

It should be noted that, in this embodiment, the first riser board 54 corresponds to the board 10 in FIG. 1 and the first board 30 in FIG. 2, while the second riser board 56 corresponds to the board 10 in FIG. 1 and the second board 36 in FIG. 2.

The first riser board 54 of the memory combination includes a plurality of first memory sockets 540. The second riser board 56 includes a plurality of second memory sockets 560. The first memory sockets 540 on the first riser board 54 and the second memory sockets 560 on the second riser board 56 are all used to plug the memory module 64. For example, the memory module 64 may be a Dual In-line Memory Module (DIMM), but the invention is not limited to such.

Additionally, the first pivotal member 60 has a first retaining structure, and the second pivotal member 62 has a second retaining structure. The pivotal plate 58 has a first protrusion 584 and a second protrusion 588. The first protrusion 584 and the second protrusion 588 are respectively located at two ends of the pivotal plate 58. The first protrusion 584 of the pivotal plate 58 is retained in the first retaining structure, so as to make the first riser board 54 limitedly rotate relative to the pivotal plate 58 to be optionally perpendicular or parallel to the pivotal plate 58. The second protrusion 588 of the pivotal plate 58 is retained in the second retaining structure, so as to make the second riser board 56 limitedly rotate relative to the pivotal plate 58 to be optionally perpendicular or parallel to the pivotal plate 58.

In this way, when the first riser board 54 and the second riser board 56 rotate relative to the pivotal plate 58 to be perpendicular to the pivotal plate 58, the invention can enable the first memory sockets 540 on the first riser board 54 to face the second riser board 56, and enable the second memory sockets 560 on the second riser board 56 to face the first riser board 54 (i.e., with an appearance as a folded book).

In order to achieve the operation that the first riser board 54 and the second riser board 56 are perpendicular or parallel to the pivotal plate 58, the detailed structure relating to the first pivotal member 60, the second pivotal member 62 and the pivotal plate 58 will be further described in details hereafter.

Figure 6:
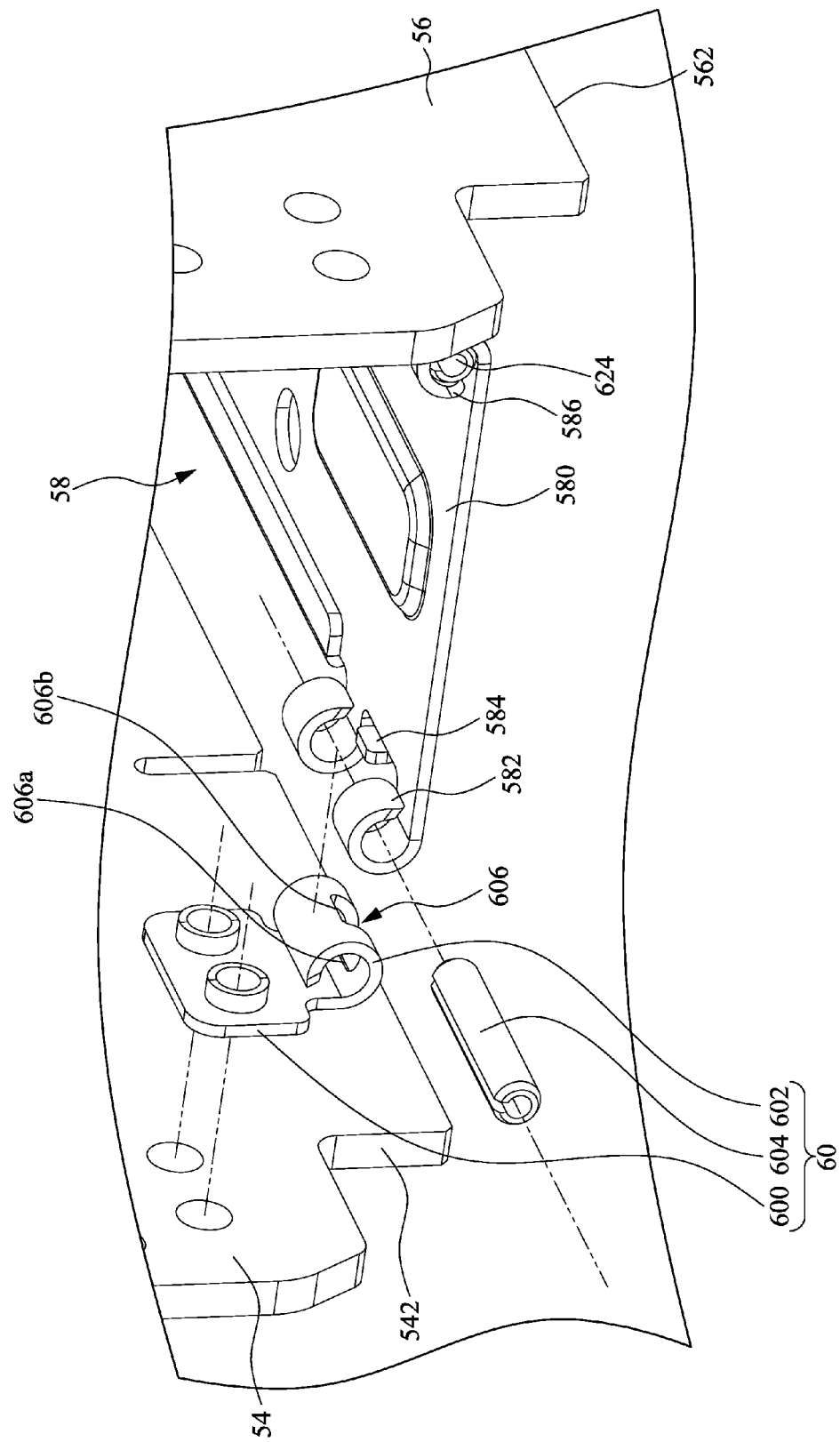
FIG. 6 is a partial exploded view illustrating the memory combination in FIG. 5A.

FIG. 6 illustrates a partial exploded view of the memory combination in FIG. 5A.

As shown in FIG. 6, in this embodiment, the first pivotal member 60 includes a first fixing portion 600, a first pivotal portion 602 and a first pivotal axis 604. The first fixing portion 600 of the first pivotal member 60 is fixed to the first riser board 54. The first pivotal portion 602 of the first pivotal member 60 is connected to the first fixing portion 600 and bent relative to the first fixing portion 600. The first pivotal axis 604 of the first pivotal member 60 is pivotally connected to the inner wall of the first pivotal portion 602.

Additionally, the pivotal plate 58 includes a main body 580 and two second pivotal portions 582. The second pivotal portions 582 of the pivotal plate 58 are connected to the main body 580 and bent relative to the main body 580. The first pivotal axis 604 is further pivotally connected to the inner walls of the second pivotal portions 582. In other words, the first pivotal portion 602 of the first pivotal member 60 and two second pivotal portions 582 of the pivotal plate 58 are all pivotally connected to the first pivotal axis 604, so that the first riser board 54 and the pivotal plate 58 can rotate relative to each other.

Moreover, in this embodiment, the first pivotal portion 602 of the first pivotal member 60 is arranged between the second pivotal portions 582 of the pivotal plate 58 side by side. Through this structure configuration it can be prevented that the first pivotal portion 602 departs from the second pivotal portions 582 along the axial direction of the first pivotal axis 604.

Also shown in FIG. 6, in this embodiment, the first retaining structure 606 of the first pivotal member 60 is a slotted hole. The first retaining structure 606 is located on the first pivotal portion 602. The first protrusion 584 of the pivotal plate 58 is connected to the main body 580, located between the second pivotal portions 582 and extends into the first retaining structure 606. The first retaining structure 606 has a first retaining edge 606a and a second retaining edge 606b opposite to each other. During rotation of the first riser board 54 relative to the pivotal plate 58 (that is, during rotation of the first pivotal portion 602 and the two second pivotal portions 582 relative to the first pivotal axis 604), the first protrusion 584 is limitedly moved between the first retaining edge 606a and the second retaining edge 606b.

Furthermore, the first retaining edge 606a of the first retaining structure 606 is adjacent to the end of the first pivotal portion 602 connected to the first fixing portion 600. The second retaining edge 606b of the first retaining structure 606 is adjacent to the end of the first pivotal portion 602 away from the first fixing portion 600. When the first riser board 54 rotates relative to the pivotal plate 58 to make the first protrusion 584 abut against the first retaining edge 606a, the first riser board 54 is parallel to the pivotal plate 58. When the first riser board 54 rotates relative to the pivotal plate 58 to make the first protrusion 584 abut against the second retaining edge 606b, the first riser board 54 is perpendicular to the pivotal plate 58.

However, the shape of the first retaining structure of the invention is not limited to the form of slotted hole. In another embodiment, the first retaining structure also may be a groove (not shown) formed at a side edge of the first pivotal portion 602, and the first protrusion 584 is correspondingly configured at the side edge of the second pivotal portion 582 and extends into the abovementioned groove, so as to make the first riser board 54 limitedly rotate relative to the pivotal plate 58 as well.

Figure 7:
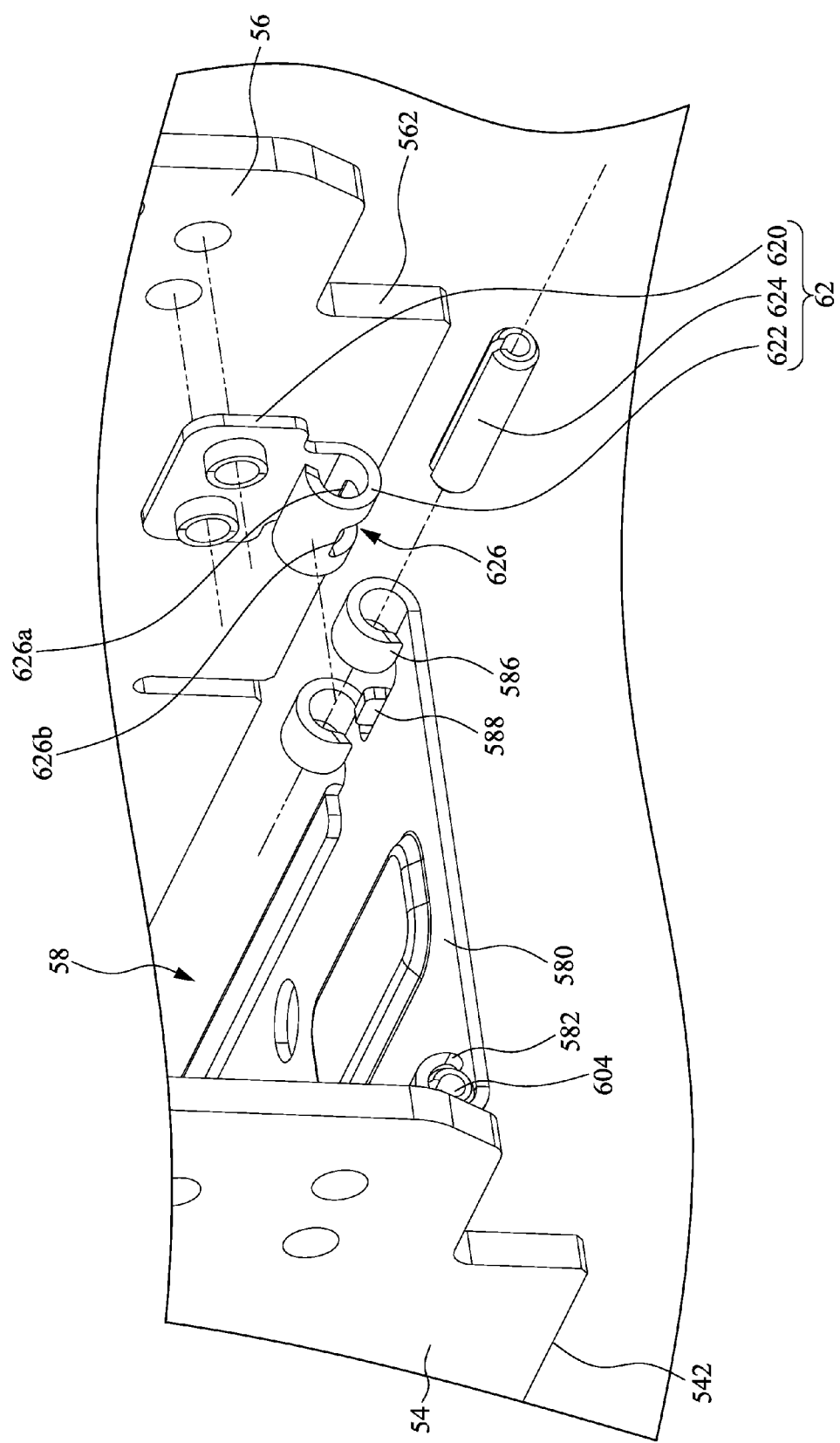
FIG. 7 is another partial exploded view illustrating the memory combination in FIG. 5A.

FIG. 7 illustrates another partial exploded view of the memory combination in FIG. 5A.

As shown in FIG. 7, in this embodiment, the second pivotal member 62 includes a second fixing portion 620, a third pivotal portion 622, and a second pivotal axis 624. The second fixing portion 620 of the second pivotal member 62 is fixed to the second riser board 56. The third pivotal portion 622 of the second pivotal member 62 is connected to the second fixing portion 620 and bent relative to the second fixing portion 620. The second pivotal axis 624 of the second pivotal member 62 is pivotally connected to the inner wall of the third pivotal portion 622.

Additionally, the pivotal plate 58 further includes two fourth pivotal portions 586. The fourth pivotal portions 586 of the pivotal plate 58 are connected to the main body 580 and bent relative to the main body 580. The second pivotal axis 624 is further pivotally connected to the inner walls of the fourth pivotal portions 586. In other words, the third pivotal portion 622 of the second pivotal member 62 and the two fourth pivotal portions 586 of the pivotal plate 58 are all pivotally connected to the second pivotal axis 624, so that the second riser board 56 and the pivotal plate 58 can rotate relative to each other.

Moreover, in this embodiment, the third pivotal portion 622 of the second pivotal member 62 is arranged between two fourth pivotal portions 586 of the pivotal plate 58 side by side. Through this structure configuration it can be prevented that the third pivotal portion 622 departs from the two fourth pivotal portions 586 along the axial direction of the second pivotal axis 624.

In this embodiment, when the first pivotal axis 604 is pivotally connected to the second pivotal portions 582 of the pivotal member, and the second pivotal axis 624 is pivotally connected to the fourth pivotal portions 586 of the pivotal member, the axial direction of the first pivotal axis 604 is parallel to the axial direction of the second pivotal axis 624. In this way, the first riser board 54 and the second riser board 56 rotate relative to the pivotal plate 58 to present an appearance of being unfolded and folded as a book.

Also shown in FIG. 7, in this embodiment, the second retaining structure 626 of the second pivotal member 62 is also a slotted hole. The second retaining structure 626 is located on the third pivotal portion 622. The second protrusion 588 of the pivotal plate 58 is connected to the main body 580, located between two fourth pivotal portions 586 and extends into the second retaining structure 626. The second retaining structure 626 has a third retaining edge 626a and a fourth retaining edge 626b opposite to each other. During rotation of the second riser board 56 relative to the pivotal plate 58 (that is, during rotation of the third pivotal portion 622 and the two fourth pivotal portions 586 relative to the second pivotal axis 624), the second protrusion 588 is limitedly moved between the third retaining edge 626a and the fourth retaining edge 626b.

Furthermore, the third retaining edge 626a of the second retaining structure 626 is adjacent to the end of the third pivotal portion 622 connected to the second fixing portion 620. The fourth retaining edge 626b of the second retaining structure 626 is adjacent to the end of the third pivotal portion 622 away from the second fixing portion 620. When the second riser board 56 rotates relative to the pivotal plate 58 to make the second protrusion 588 abut against the third retaining edge 626a, the second riser board 56 is parallel to the pivotal plate 58. When the second riser board 56 rotates relative to the pivotal plate 58 to make the second protrusion 588 abut against the fourth retaining edge 626b, the second riser board 56 is perpendicular to the pivotal plate 58.

In view of the above, when the first protrusion 584 abuts against the first retaining edge 606a and the second protrusion 588 abuts against the third retaining edge 626a, the first riser board 54 and the second riser board 56 are parallel to the pivotal plate 58 and present an appearance as an unfolded book. When the first protrusion 584 abuts against the second retaining edge 606b and the second protrusion 588 abuts against the fourth retaining edge 626b, the first riser board 54 and the second riser board 56 are perpendicular to the pivotal plate 58 and present an appearance as a folded book.

Additionally, as shown in FIG. 4, the first riser board 54 further includes a first control chip 544. The first control chip 544 of the first riser board 54 is electrically connected to the first memory sockets 540, so as to control and process the data exchange between the memory modules 64 plugged into the first memory sockets 540 and the motherboard 52. The second riser board 56 further includes a second control chip 564. The second control chip 564 of the second riser board 56 is electrically connected to the second memory sockets 560, so as to control and process the data exchange between the memory modules 64 plugged into the second memory sockets 560 and the motherboard 52.

The first memory sockets 540 on the first riser board 54 are arranged closely. The second memory sockets 560 on the second riser board 56 are arranged closely. Furthermore, when the first riser board 54 and the second riser board 56 are perpendicular to the pivotal plate 58, the region of the first memory sockets 540 is aligned with the region of the second control chip 564, while the region of the second memory sockets 564 is aligned with the region of the first control chip 544.

Therefore, through a pivotal structure mutually matched between the first riser board 54 and the pivotal plate 58 and a pivotal structure mutually matched between the second riser board 56 and the pivotal plate 58, the invention can enable the first riser board 54 and the second riser board 56 to maintain a distance therebetween when being folded to each other, thereby avoiding that the memory modules 64 plugged onto the first riser board 54 come into collision with the second control chip 564 on the second riser board 56, as well as avoiding that the memory modules 64 plugged onto the second riser board 56 come into collision with the first control chip 544 on the first riser board 54.

However, the shape of the second retaining structure of the invention is not limited to the form of the slotted hole. In another embodiment, the second retaining structure also may be a groove (not shown) formed at the side edge of the third pivotal portion 622, and the second protrusion 588 is correspondingly configured at the side edge of the fourth pivotal portion 586 and extends into the abovementioned groove, so as to make the second riser board 56 limitedly rotate relative to the pivotal plate 58 as well.

As shown in FIGS. 5A and 5B, in this embodiment, the motherboard 52 of the computer system 5 is configured in the housing 50. The motherboard 52 at least includes a first riser slot 520 and a second riser slot 522 configured side by side. That is, in this embodiment, the first and second riser slots 520, 522 of the motherboard 52 are parallel and adjacent to each other.

However, the motherboard 52 may include more than one group of the first riser slot 520 and the second riser slot 522. In actual applications, the number of groups of the first riser slot 520 and the second riser slot 522 included on the motherboard 52 can be optionally increased or decreased according to actual demands.

Additionally, as shown in FIGS. 4-5B, in this embodiment, the first riser board 54 of the memory combination has a first connection port 542, and the first connection port 542 is located at a first edge E1 of the first riser board 54. The first connection port 542 of the first riser board 54 is used to be plugged into the first riser slot 520 of the motherboard 52. The second riser board 56 of the memory combination has a second connection port 562, and the second connection port 562 is located at a second edge E2 of the second riser board 56. The second connection port 562 of the second riser board 56 is used to be plugged into the second riser slot 522 of the motherboard 52.

In this embodiment, the first pivotal member 60 is fixed onto the first riser board 54 to be adjacent to the first edge E1, and the second pivotal member 62 is fixed onto the second riser board 56 to be adjacent to the second edge E2. The first edge E1 of the first riser board 54 is parallel to the axial direction of the first pivotal axis 604, and the second edge E2 of the second riser board 56 is parallel to the axial direction of the second pivotal axis 624. When the first riser board 54 and the second riser board 56 rotate relative to the pivotal plate 58 to be parallel to the pivotal plate 58, the first connection port 542 is just opposite to the second connection port 562. In other words, when the first riser board 54 and the second riser board 56 rotate relative to the pivotal plate 58 to be parallel to the pivotal plate 58, the pivotal plate 58, the first connection port 542 and the second connection port 562 are all located between the first riser board 54 and the second riser board 56 (i.e., between the first edge E1 and the second edge E2).

However, the invention is not limited to this. In another embodiment, the first connection port 542 of the first riser board 54 is located at a third edge E3 of the first riser board 54 to be away from and parallel to the first edge E1, while the second connection port 562 of the second riser board 56 is located at a fourth edge E4 of the second riser board 56 to be away from and parallel to the second edge E2. In other words, when the first riser board 54 and the second riser board 56 rotate relative to the pivotal plate 58 to be perpendicular to the pivotal plate 58, the pivotal plate 58 is located at the same side of the first riser board 54 and the second riser board 56 (i.e., the side of the first edge E1 and the second edge E2), while the first connection port 542 and the second connection port 562 are located at the other side of the first riser board 54 and the second riser board 56 (i.e., the side of the third edge E3 and the fourth edge E4).

In still another embodiment, the first connection port 542 of the first riser board 54 is located at a fifth edge E5 of the first riser board 54 to be perpendicular to the first edge E1, while the second connection port 562 of the second riser board 56 is located at a sixth edge E6 of the second riser board 56 to be perpendicular to the second edge E2 (as the top edges of the first riser board 54 and the second riser board 56 shown in FIG. 4). In other words, when the first riser board 54 and the second riser board 56 rotate relative to the pivotal plate 58 to be perpendicular to the pivotal plate 58, the pivotal plate 58 is located at the same side of the first riser board 54 and the second riser board 56 (i.e., the side of the first edge E1 and the second edge E2), while the first connection port 542 and the second connection port 562 are located at the other side of the first riser board 54 and the second riser board 56 (i.e., the side of the fifth edge E5 and the sixth edge E6).

Alternatively, in yet another embodiment, the first connection port 542 of the first riser board 54 is located at a seventh edge E7 of the first riser board 54 to be perpendicular to the first edge E1, while the second connection port 562 of the second riser board 56 is located at a eighth edge E8 of the second riser board 56 to be perpendicular to the second edge E2 (as the bottom edges of the first riser board 54 and the second riser board 56 shown in FIG. 4). In other words, when the first riser board 54 and the second riser board 56 rotate relative to the pivotal plate 58 to be perpendicular to the pivotal plate 58, the pivotal plate 58 is located at the same side of the first riser board 54 and the second riser board 56 (i.e., the side of the first edge E1 and the second edge E2), and the first connection port 542 and the second connection port 562 are located at the other side of the first riser board 54 and the second riser board 56 (i.e., the side of the seventh edge E7 and the eighth edge E8).

In view of the above, when the first riser board 54 and the second riser board 56 rotate relative to the pivotal plate 58 to be perpendicular to the pivotal plate 58, as long as the first connection port 542 and the second connection port 562 are located at the same side of the first riser board 54 and the second riser board 56, it can be achieved that the first connection port 542 and the second connection port 562 are respectively plugged into the first riser slot 520 and the second riser slot 522 of the motherboard 52.

In addition, it should be noted that, here, in order to place more memory modules 64 in the limited space of the computer system 5, in the invention the first memory sockets 540 on the first riser board 54 and the second memory sockets 560 on the second riser board 56 are unaligned with each other.

As shown in FIG. 4, in this embodiment, the first memory sockets 540 on the first riser board 54 are closely arranged to form a memory socket group, and the second memory sockets 560 on the second riser board 56 are closely arranged to form another memory socket group. In this way, during the process that the first riser board 54 and the second riser board 56 rotate relative to the pivotal plate 58 to be perpendicular to the pivotal plate 58, the first memory sockets 540 on the first riser board 54 and the second memory sockets 560 on the second riser board 56 are unaligned with each other in an arrangement form of groups, which can effectively utilize the space between the first riser board 54 and the second riser board 56.

From the above detailed description for the specific embodiments of the invention, it can be obviously seen that, an essential feature of the invention is that two boards of the pivotal assembly are pivotally connected with the pivotal plate through two pivotal members, respectively, so that the two boards are capable to be unfolded and folded like a book. Another essential feature of the invention is that each of the two pivotal members, respectively, have a retaining structure for retaining the corresponding protrusion configured on the pivotal plate, so that the two boards are capable to maintain a distance therebetween when being folded, thereby avoiding collision with each other on the two boards.

Although the invention has been disclosed with reference to the above embodiments, these embodiments are not intended to limit the invention. Those of skills in the art can make various variations and modifications without departing from the spirit and scope of the invention. Therefore, the scope of the invention should be defined by the appended claims.

What is claimed is:

1. A pivotal assembly applied to a board, comprising:
  a first board;
  a first pivotal member fixed to the first board and having a first retaining structure;
  a pivotal plate pivotally connected to the first pivotal member and having a first protrusion and a second protrusion, wherein the first protrusion and the second protrusion are respectively located at two ends of the pivotal plate;
  a second board; and
  a second pivotal member fixed to the second board and having a second retaining structure, wherein the first pivotal member and the second pivotal member are pivotally connected to the two ends of pivotal plate,
  wherein the first protrusion is retained in the first retaining structure, so as to make the first board limitedly rotate to be perpendicular or parallel to the pivotal plate,
  wherein the second protrusion is retained in the second retaining structure, so as to make the second board limitedly rotate to be perpendicular or parallel to the pivotal plate, and when both of the first board and the second board are perpendicular to the pivotal plate, the first board and the second board are located face to face.

2. The pivotal assembly applied to board of claim 1, wherein the first pivotal member comprises:
  a first fixing portion fixed to the first board;
  a first pivotal portion connected to the first fixing portion and bent relative to the first fixing portion; and
  a first pivotal axis pivotally connected to the inner wall of the first pivotal portion.

3. The pivotal assembly applied to board of claim 2, wherein the pivotal plate comprises:
  a main body; and
  two second pivotal portions connected to the main body and bent relative to the main body, wherein the first pivotal portion is arranged between the second pivotal portions side by side, and the first pivotal axis is further pivotally connected to the inner walls of the second pivotal portions.

4. The pivotal assembly applied to board of claim 3, wherein the first retaining structure is located on the first pivotal portion, the first protrusion is connected to the main body and extends into the first retaining structure, the first retaining structure has a first retaining edge and a second retaining edge opposite to each other, and during rotation of the first board relative to the pivotal plate, the first protrusion is limitedly moved between the first retaining edge and the second retaining edge.

5. The pivotal assembly applied to board of claim 4, wherein the first retaining edge is adjacent to the end of the first pivotal portion that is connected to the first fixing portion, and the second retaining edge is adjacent to the end of the first pivotal portion that is away from the first fixing portion, when the first board rotates relative to the pivotal plate to make the first protrusion abut against the first retaining edge, the first board is parallel to the pivotal plate, and when the first board rotates relative to the pivotal plate to make the first protrusion abut against the second retaining edge, the first board is perpendicular to the pivotal plate.

6. The pivotal assembly applied to board of claim 1, wherein the second pivotal member comprises:
- a second fixing portion fixed to the second board;
- a third pivotal portion connected to the second fixing portion and bent relative to the second fixing portion; and
- a second pivotal axis pivotally connected to the inner wall of the third pivotal portion.

7. The pivotal assembly applied to board of claim 6, wherein the pivotal plate comprises:
- a main body; and
- two fourth pivotal portions connected to the main body and bent relative to the main body, wherein the third pivotal portion is arranged between the fourth pivotal portions side by side, and the second pivotal axis is further pivotally connected to the inner walls of the fourth pivotal portions.

8. The pivotal assembly applied to board of claim 7, wherein the second retaining structure is located on the second pivotal portion, the second protrusion is connected to the main body and extends into the second retaining structure, the second retaining structure has a third retaining edge and a fourth retaining edge opposite to each other, and during rotation of the second board relative to the pivotal plate, the second protrusion is limitedly moved between the third retaining edge and the fourth retaining edge.

9. The pivotal assembly applied to board of claim 8, wherein the third retaining edge is adjacent to the end of the second pivotal portion that is connected to the second fixing portion, and the fourth retaining edge is adjacent to the end of the second pivotal portion that is away from the second fixing portion, when the second board rotates relative to the pivotal plate to make the second protrusion abut against the third retaining edge, the second board is parallel to the pivotal plate, and when the second board rotates relative to the pivotal plate to make the second protrusion abut against the fourth retaining edge, the second board is perpendicular to the pivotal plate.

* * * * *